(12) United States Patent
Hyoung et al.

(10) Patent No.: US 11,747,380 B2
(45) Date of Patent: Sep. 5, 2023

(54) ELECTROMAGNETIC WAVE EVALUATION APPARATUS WITH ADJUSTABLE QUALITY FACTOR

(71) Applicant: ELECTRONICS AND TELECOMMUNICATIONS RESEARCH INSTITUTE, Daejeon (KR)

(72) Inventors: Chang Hee Hyoung, Daejeon (KR); Jong Hwa Kwon, Daejeon (KR); Jung Hwan Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/734,298

(22) Filed: May 2, 2022

(65) Prior Publication Data

US 2023/0061785 A1 Mar. 2, 2023

(30) Foreign Application Priority Data

Aug. 27, 2021 (KR) .......................... 10-2021-0113850

(51) Int. Cl.
*G01R 29/08* (2006.01)
*H01Q 15/18* (2006.01)
*G01R 31/00* (2006.01)

(52) U.S. Cl.
CPC ....... *G01R 29/0821* (2013.01); *G01R 31/001* (2013.01); *H01Q 15/18* (2013.01)

(58) Field of Classification Search
CPC .. G01R 29/08; G01R 29/0821; G01R 29/0835; G01R 31/001; H01Q 15/18; H01Q 17/00
See application file for complete search history.

(56) References Cited

U.S. PATENT DOCUMENTS

| 8,462,039 | B2 | 6/2013 | Park et al. |
| 8,693,158 | B2 | 4/2014 | Chew et al. |
| 9,035,817 | B2 | 5/2015 | Sim |
| 9,276,325 | B2 | 3/2016 | Sim |

(Continued)

FOREIGN PATENT DOCUMENTS

| EP | 2256507 A1 | 12/2010 | |
| EP | 3865886 A1 * | 8/2021 | ......... G01R 29/0821 |

(Continued)

*Primary Examiner* — Hoang V Nguyen
(74) *Attorney, Agent, or Firm* — LRK PATENT LAW FIRM

(57) ABSTRACT

An apparatus for electromagnetic wave evaluation may include: an electromagnetic wave non-reflecting outer structure in which electromagnetic wave absorbers are installed on interior walls and an evaluation space is formed therein; a building-simulating structure which is installed in the evaluation space inside the electromagnetic wave non-reflecting outer structure and in which electromagnetic wave absorbers capable of adjusting a quality factor are installed; a transmitting end installed inside or outside the building-simulating structure in the evaluation space and transmitting an electromagnetic wave; and a receiving end installed outside or inside the building-simulating structure in the evaluation space.

20 Claims, 15 Drawing Sheets

(56) References Cited

U.S. PATENT DOCUMENTS

| | | |
|---|---|---|
| 9,746,423 B2 | 8/2017 | Sayler et al. |
| 10,145,804 B2 | 12/2018 | Sayler et al. |
| 10,598,711 B2 | 3/2020 | Sim et al. |
| 10,928,432 B2 | 2/2021 | Sim et al. |
| 2016/0131689 A1 | 5/2016 | Monsef |

FOREIGN PATENT DOCUMENTS

| | | | | |
|---|---|---|---|---|
| KR | 10-1442557 B1 | 9/2014 | | |
| KR | 10-1744131 B1 | 6/2017 | | |
| KR | 20180017658 A | * | 2/2018 | ............. G01R 29/08 |

\* cited by examiner

ELECTROMAGNETIC WAVE EVALUATION APPARATUS WITH ADJUSTABLE QUALITY FACTOR

CROSS-REFERENCE TO RELATED APPLICATION

This application claims priority to Korean Patent Application No. 10-2021-0113850 filed on Aug. 27, 2021 with the Korean Intellectual Property Office (KIPO), the entire contents of which are hereby incorporated by reference.

BACKGROUND

1. Field of the Invention

Exemplary embodiments of the present disclosure relate to an electromagnetic wave evaluation apparatus capable of adjusting a quality factor of interfaces and an indoor space.

2. Description of Related Art

The present disclosure relates to an electromagnetic wave evaluation apparatus for testing electromagnetic wave attenuation and indoor electromagnetic wave environments due to a general large-scale building by using a facility developed or manufactured for a special purpose related to electromagnetic waves, such as an anechoic chamber, a semi-anechoic chamber, and an electromagnetic wave reverberation room.

Shielding facilities or racks are being used to protect important facilities from intentional electromagnetic wave attacks. These facilities or devices are generally located within a building where important facilities or equipments are operated, and for safety reasons, they are located inside the building or in a basement thereof, not in a space in the building facing exterior walls.

In case of a general building where the shielding facilities and/or racks are installed, there is no standardized scheme to evaluate electromagnetic wave attenuation even though it occurs. When considering the electromagnetic wave attenuation characteristics by the building, the shielding effects required for the shielding facilities and/or racks will be lowered, and accordingly, the budget for constructing such protective facilities can be reduced.

Concrete, glass, and steel frames are mainly used in modern buildings, and accordingly, modern buildings are largely classified into buildings using concrete and glass and buildings using steel and glass. There are also cases where metal panels are applied to exterior walls of buildings for various reasons. The electromagnetic wave shielding properties of materials used in the buildings are very different. In the case of metal, although the shielding effect is slightly different depending on the conductivity, thickness, and frequency, it has a high shielding effect of 80 dB or more, while glass has almost no loss in terms of electromagnetic wave.

Recently, in order to improve thermal efficiency, by inserting a layer of dry air and/or a metal thin film for preventing condensation of multi-layer structures on a surface of glass, the glass having a relatively high shielding effect compared to general tempered glass is being applied to buildings. Concrete also has been applied to structures with improved physical durability through the insertion of grid-shaped reinforcing bars. Even with the same type of building materials, the shielding effect varies depending on a composition ratio and thickness of the reinforcing bars.

In the case of general buildings, as various types of building materials are used, materials having a very large difference in shielding effects constitute interfaces (i.e., boundary surfaces). However, there is no standardized scheme for evaluating electromagnetic wave attenuation for a space configured with interfaces of complex structures. In addition, when measuring electromagnetic wave attenuation for a real building, there is a problem in that, even if a standardized evaluation scheme for shielding facilities is applied, surrounding buildings and devices other than the building to be evaluated are exposed to strong electromagnetic waves.

In order to develop a standardized measurement method, a facility for evaluation of electromagnetic waves that can simulate a space in a building made of materials with different shielding effects is needed. In addition, although an electromagnetic wave reverberation room was used as a facility capable of simulating an indoor radio wave environment in the past, the electromagnetic wave reverberation room is made of metal having a shielding effect of 80 dB or more. In addition, wiring, ventilation facilities, and door structures are also required to have a shielding effect of 80 dB or more. The electromagnetic wave reverberation room made of metal with excellent shielding properties forms more complex and harsh conditions than the electromagnetic wave environment in the general building. While a quality factor (i.e., Q factor) of the electromagnetic wave reverberation room is very high, a quality factor of a real general building space has a lower value because it is composed of interfaces with low shielding effects although many reflections occur.

In the case of the electromagnetic wave reverberation room, it is necessary to lower the quality factor by attaching absorbers to walls in order to secure similarity to the real space in the building. Although the quality factor of the real building space and the quality factor of the reverberation chamber are kept similar, there is a problem that transmission characteristics at the interfaces occurring in the general building cannot be reflected.

SUMMARY

Accordingly, exemplary embodiments of the present disclosure are provided to substantially obviate one or more problems due to limitations and disadvantages of the related art.

Exemplary embodiments of the present disclosure provide an electromagnetic wave evaluation apparatus capable of adjusting a quality factor for measuring electromagnetic wave attenuation by a general building. Specifically, in the electromagnetic wave evaluation apparatus according to the present disclosure, a plane wave is applied to a building to be evaluated based on a continuous wave injection scheme as in the standards defining an evaluation method for shielded facilities, and an electromagnetic wave attenuation, which is defined as a ratio of a received power in the building to an incident power, is measured.

According to an exemplary embodiment of the present disclosure for achieving the above-described objective, an apparatus for electromagnetic wave evaluation may comprise: an electromagnetic wave non-reflecting outer structure in which electromagnetic wave absorbers are installed on interior walls and an evaluation space is formed therein; a building-simulating structure which is installed in the evaluation space inside the electromagnetic wave non-reflecting outer structure and in which electromagnetic wave absorbers capable of adjusting a quality factor are installed;

a transmitting end installed inside or outside the building-simulating structure in the evaluation space and transmitting an electromagnetic wave; and a receiving end installed outside or inside the building-simulating structure in the evaluation space.

The electromagnetic wave absorbers installed on the interior walls of the electromagnetic wave non-reflecting outer structure may have a material and shape for reducing electromagnetic wave reflection, and at least part of the electromagnetic wave absorbers may use a metal material with a high shielding effect to block an influence of experiments conducted in the evaluation space using the electromagnetic wave on external facilities.

When the transmitting end is located outside the building-simulating structure, the transmitting end may be spaced apart from the building-simulating structure by a distance at which the electromagnetic wave is approximated as a plane wave and injected into the building-simulating structure in a continuous wave injection scheme, and the transmitting end may include a signal generator and a transmit antenna for applying a continuous wave signal so that the building-simulating structure is positioned within a half-power beam width (HPBW) of the continuous wave signal.

A receive antenna of the receiving end may be at least one of an electric field probe, a magnetic field probe, an isotropic antenna, a directional antenna, or a combination thereof capable of measuring electric field strengths, magnetic field strengths, or electric powers at various positions outside or inside the building-simulating structure, and the receiving end may include a measuring instrument associated with the receive antenna.

The building-simulating structure may further include: a fixing frame installed in at least some corners; and a plurality of electromagnetic wave absorbing walls that are installed using the fixing frame, are replaceable so that materials thereof are changeable, and are made of electromagnetic wave absorbers.

Four sides of the building-simulating structure may be composed of the electromagnetic wave absorbing walls composed of electromagnetic wave absorbers having an equivalent loss to an electromagnetic wave transmission loss of concrete, and when sponge-type electromagnetic wave absorbers are used, a sponge-type base material having a certain thickness may be formed in two or three layers so as to have a predetermined transmission loss.

A floor surface of the building-simulating structure may use an absorber material capable of simulating electromagnetic wave characteristics of a floor surface of a real building or use a floor surface of the electromagnetic wave non-reflecting outer structure, and further include a grounded base surface.

A ceiling surface of the building-simulating structure may use electromagnetic wave absorbers having a greater transmission loss than electromagnetic wave absorbers of an electromagnetic wave absorption wall used on a side surface of the building-simulating structure, or may be configured by adding electromagnetic wave absorbers of the electromagnetic wave absorption wall used on the side surface.

The building-simulating structure may include a fixing frame made of a metal material in which a size of a grid structure is designed to have a cut-off frequency below a frequency to be evaluated.

When a cut-off frequency of a metal frame used for fixing electromagnetic wave absorbers of a unit size is within a frequency to be evaluated, the building-simulating structure may include a fixing frame of a non-metal material having a low dielectric constant to minimize an influence on the frequency to be evaluated.

The building-simulating structure may have an aperture without absorbers for a test on an indoor electromagnetic wave environment and an electromagnetic wave attenuation by a space having a tempered glass structure with little shielding effects.

The aperture includes a window frame composed of a grid-shaped metal fixing frame, and an inner side of the window frame may be composed of tempered glass having a multi-layer structure.

A flat or three-dimensional electromagnetic wave control unit capable of adjusting a reflection or absorption phenomenon may be disposed in the building-simulating structure to simulate an indoor electromagnetic wave environment experienced by the electromagnetic wave.

The electromagnetic wave control unit may be composed of a metal reflector having high conductivity to implement a reflection environment, or may be composed of at least one of an electric field absorbing material, a magnetic field absorbing material, a material acting on both an electric field and a magnetic field, or a combination thereof to implement an absorption environment.

An electromagnetic wave stirrer of a flat or three-dimensional structure may be installed, which is formed with a plurality of metal blades rotating at a constant angle or at a constant speed to simulate an indoor electromagnetic wave environment, or is formed with a plurality of blades to which an absorber is attached.

A plurality of electromagnetic wave interfaces made of a same material having a certain amount of transmission loss and a certain amount of insertion loss may be formed so as to have different transmission losses according to different thicknesses.

The building-simulating structure may be composed of electromagnetic wave absorbers in which a thin film having a metal pattern is inserted or electromagnetic wave absorbers in which a metal pattern is formed.

The building-simulating structure may be composed of absorbers that simulate loss and frequency characteristics equivalent to those of concrete and into which a thin film having a metal pattern is inserted in order to simulate reinforcing bars used in concrete building production.

The building-simulating structure may be composed of a composite electromagnetic wave absorber in which a thin film having a metal pattern of a conductive lattice structure is inserted between electromagnetic wave absorbers.

The building-simulating structure may be composed of a composite electromagnetic wave absorber having a grid-shaped metal pattern on one or both surfaces thereof.

As described above, unlike the existing shielded room and electromagnetic wave reverberation room, the electromagnetic wave evaluation apparatus according to the exemplary embodiment of the present disclosure can control the electromagnetic wave transmission characteristics of interfaces of a general building, and can control indoor absorption, scattering, reflection, diffraction, and the like. Accordingly, based on the structure capable of simulating the interfaces of the general building and indoor electromagnetic wave environments having different shielding effects, the electromagnetic wave evaluation apparatus can provide the function of simulating and analyzing an electromagnetic wave environment formed indoors by electromagnetic waves incident from the outside as well as electromagnetic wave attenuation due to a high-power electromagnetic wave attack. In addition, since it is easy to change the structure using light materials, various electromagnetic wave environments can be implemented, and it can be used as a reproducible indoor electromagnetic wave environment standard facility. That is, the electromagnetic wave evaluation apparatus according to the exemplary embodiment of the present disclosure can be used for evaluating electromagnetic wave-related characteristics for building materials, parts materials for electric and electronic devices, etc., and can be used as a basic facility for establishing a standardized evaluation method.

BRIEF DESCRIPTION OF DRAWINGS

Exemplary embodiments of the present disclosure will become more apparent by describing exemplary embodiments of the present disclosure in detail with reference to the accompanying drawings, in which.

DETAILED DESCRIPTION OF THE EMBODIMENTS

Figure 1:
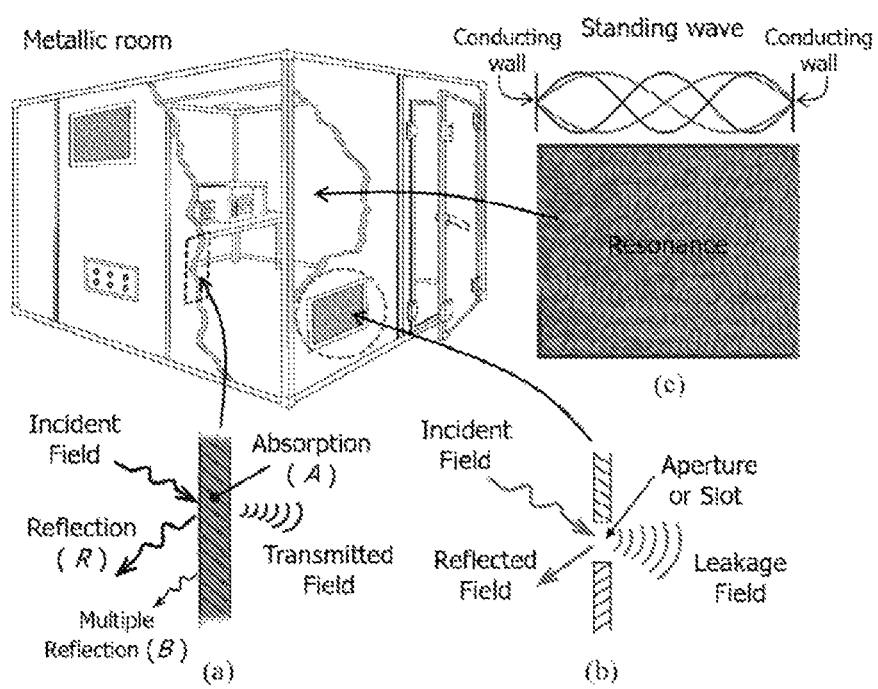
FIG. 1 is a conceptual diagram for describing an electromagnetic wave evaluation apparatus for shielded room with metallic walls.

Exemplary embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein.

Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

In exemplary embodiments of the present disclosure, "at least one of A and B" may refer to "at least one A or B" or "at least one of one or more combinations of A and B". In addition, "one or more of A and B" may refer to "one or more of A or B" or "one or more of one or more combinations of A and B".

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred exemplary embodiments of the present disclosure will be described in more detail with reference to the accompanying drawings. In describing the present disclosure, in order to facilitate an overall under-standing, the same reference numerals are used for the same elements in the drawings, and duplicate descriptions for the same elements are omitted.

In order to achieve the above-described technical objectives, the present disclosure proposes an electromagnetic wave evaluation facility capable of analyzing electromagnetic wave attenuation by a large structure or electromagnetic wave distribution within the large structure. For the detailed description of configurations and operations of the present disclosure, the configurations will be described with reference to the detailed drawings. In the case of electromagnetic wave absorbers described in the present disclosure, the absorbers may have materials that equivalently simulate electromagnetic wave transmissions, losses, and/or absorptions of walls in a general large building, and are not limited to electromagnetic wave absorbers used for the existing electromagnetic wave shielding and absorption.

FIG. 1 is a conceptual diagram for describing an electromagnetic wave evaluation apparatus capable of adjusting a quality factor.

Referring to FIG. 1, shielding effects of a large metal shielding facility of an electromagnetic wave evaluation apparatus are described. In FIG. 1, (a) describes a material effect, (b) describes a leakage effect due to an aperture or slot, and (c) describes a standing wave effect.

The metal shielding facility is typically used to electromagnetically and mechanically protect internal equipments and systems from unwanted noises and unintended electromagnetic fields such as electromagnetic pulses. The shielding effects, which indicate the shielding performance of the metal shielding facility, are determined based on three effects.

The first effect is the material effect, and the other two are the structural effects. Electromagnetic fields, especially magnetic fields, may penetrate a material unless the thickness of the material is greater than the depth of a surface layer. Therefore, the material effect is determined by the thickness and two material properties such as conductivity and permeability. These properties should be considered when shielding magnetic fields in a low frequency range, and to analyze them, a diffusion effect analysis solution or numerical simulation may be used.

The second effect is the leakage effect of apertures or slots on the surfaces of the metal shielding facility. In a real situation, apertures or seams of various shapes are unavoidable parts of the shielding facility, which are for ventilation, doorways, cable connections, etc. As the large shielding facility, such as a shielded room, ages over time, unwanted seams or gaps may occur. The shielding performance of the shielding facility for protecting critical equipments and systems from external electromagnetic fields is compromised by these seams or gaps. For full protection against electromagnetic wave attacks, the apertures and slots in the metal shielding facility should be properly treated and managed by using a variety of gasketing components. In general, standardized methods of shielding measurement, such as MIL STD 188 125-1 and IEEE STD 299, are used to find unknown apertures or slots in a shielded room or to evaluate shielding properties thereof. These methods dispose transmit (Tx) and receive (Rx) antennas to measure a shielding effectiveness (SE). The transmit and receive antennas are spaced with a specified distance from a shielding wall outside and inside the shielded room, respectively. However, if a large shielded room is already installed inside a building, there may be no space to dispose the transmit antenna outsides. It may also be difficult to dispose the receive antenna in the room because the inside of the large shielded room may be already filled with many devices or systems. Also, even if it is possible to measure it, it takes a lot of time and cost to measure it.

The third effect is that standing waves are generated within the metal shielding facility. Electromagnetic fields penetrating the metal shielding facility may generate many resonant modes due to standing waves that are continuously reflected off walls of the shielding facility. Standing waves and resonances increase an electric field strength at a resonant frequency, lower the shielding performance, and eventually negatively affect the shielding structure and internal equipments within the facility. This phenomenon begins to occur at lower frequencies the larger the metal shielding facility, such as a shielded room or facility.

Previous experiments have shown that the shielding performance of a small shielding facility such as a desktop case is improved when there are losses such as printed circuit boards (PCBs) in the small shielding facility. In addition, to estimate the shielding performance of the shielding facility, measurements on an absorbing cross-section of the PCB were performed using a reverberation chamber. For this purpose, research is being conducted assuming that the small shielding facility is in a stirred state, which can improve the shielding performance of the shielding facility. However, if the shielding facility is not in a stirring environment, the shielding performance characteristics of the shielding facility may vary depending on positions of absorbers. Therefore, it is necessary to investigate how the absorber affects the shielding performance of the shielding facility in a large shielding structure with a comparative anti-reverberation environment.

Meanwhile, studies were conducted to optimize the number and location of ferrite tile absorbers in order to design a cost-effective anechoic chamber with minimal use of ferrite tiles. There was a study suggesting that the resonance modes caused by the standing waves generated from the electromagnetic waves incident to the shielding facility due to unknown apertures or slots can be reduced by disposing the ferrite absorbers on a part of the walls, and thus the shielding performance can be improved.

FIGS. 2A to 2H are conceptual diagrams for describing an electromagnetic wave evaluation apparatus capable of adjusting a quality factor according to an exemplary embodiment of a shielded room.

Figure 2A:
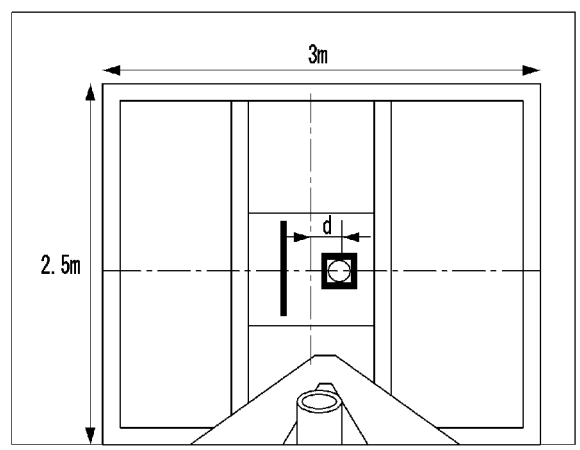
FIGS. 2A to 2H are conceptual diagrams for describing an electromagnetic wave evaluation apparatus for a shielded room on which an aperture is formed and in which absorbers are installed on interior walls.
Figure 2B:
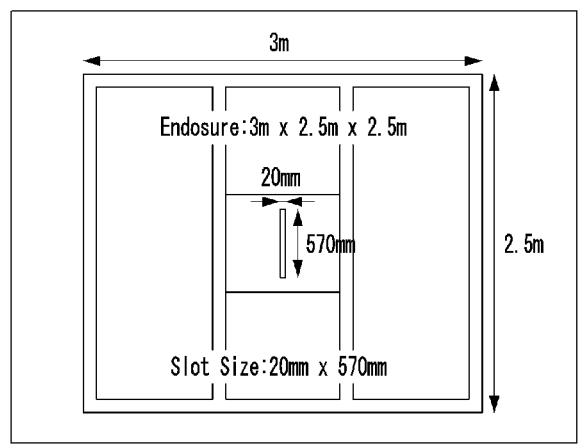
Figure 2C:
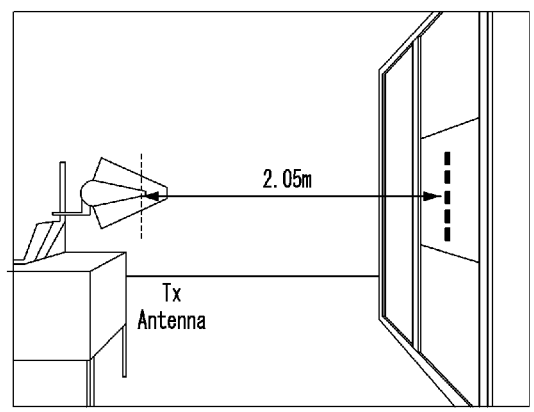
Figure 2D:
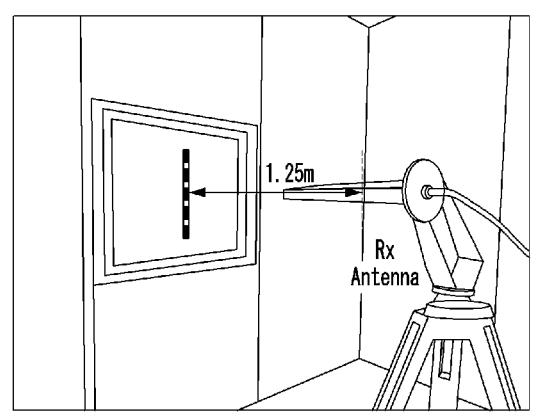
Figure 2E:
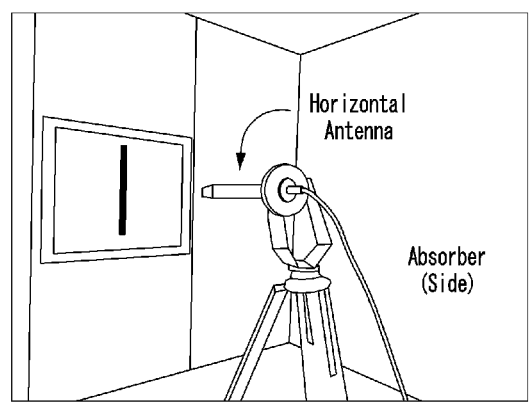
Figure 2F:
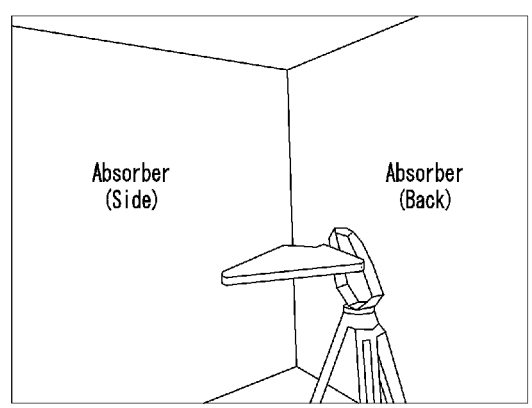
Figure 2G:
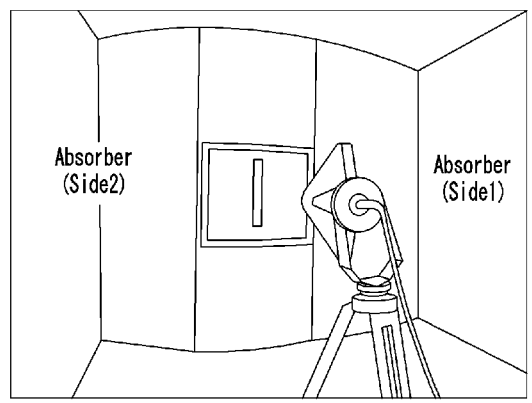
Figure 2H:
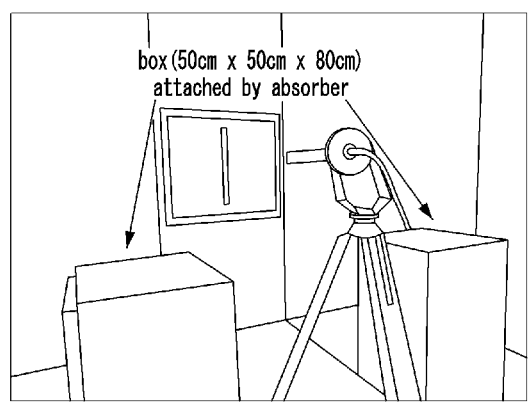

Referring to FIGS. 2A to 2H, environments for measuring the shielding performance of the shielding facility using the electromagnetic wave evaluation apparatus capable of adjusting a quality factor are shown. Specifically, FIG. 2A shows a front view of a shielded chamber with a circular aperture (diaphragm), FIG. 2B shows a front view of a shielded chamber with a long slot, FIG. 2C shows a front view of a transmit (Tx) antenna 301 in front of a shielded room, FIG. 2D shows an indoor receive (Rx) antenna 301', FIG. 2E shows an absorber attached to a sidewall, FIG. 2F shows absorbers attached to a back side and a sidewall, FIG. 2G shows absorbers attached to both walls, and FIG. 2H shows two boxes each having an absorbent material on a floor.

Theoretical shielding analysis using the electromagnetic wave evaluation apparatus according to an exemplary embodiment of the present disclosure may be performed based on a Q factor, which indicates the shielding performance of the shielding facility, as follows.

As a useful method for analyzing a reverberation room, an analysis method using a Q factor may be used for shielding analysis of a shielding facility in which a widely used lossy material exists. However, it is difficult to calculate the Q factor with an analytical approach when absorbers with arbitrary shapes exist in the shielding facility. Therefore, a method of extracting the quality factor of the absorbers based on a quality factor theory may be used. Through numerical simulation or measurement on a metal shielding facility, the quality factor of the absorbers used in the shielded room may be extracted, and the shielding effectiveness (i.e., SE) of the shielding facility having apertures of various sizes may be easily calculated. In addition, there is an advantage in that the shielding improvement by the absorbers can be quantitatively separated and calculated.

The SE of the shielded room, which is a shielded space having apertures and losses or absorbent materials, may be defined as Equation 1.

$$SE = 10\log_{10}\left(\frac{S_i}{S_c}\right) = 10\log_{10}\left(\frac{Q_3}{Q}\right) \quad \text{[Equation 1]}$$

Here, $S_i$ denotes a power density incident into the shielded room, and $S_c$ denotes a power density inside the shielded room. Q denotes a total quality factor of the shielded room, and $Q_3$ denotes a quality factor due to an aperture of the shielded room.

Figure 3:
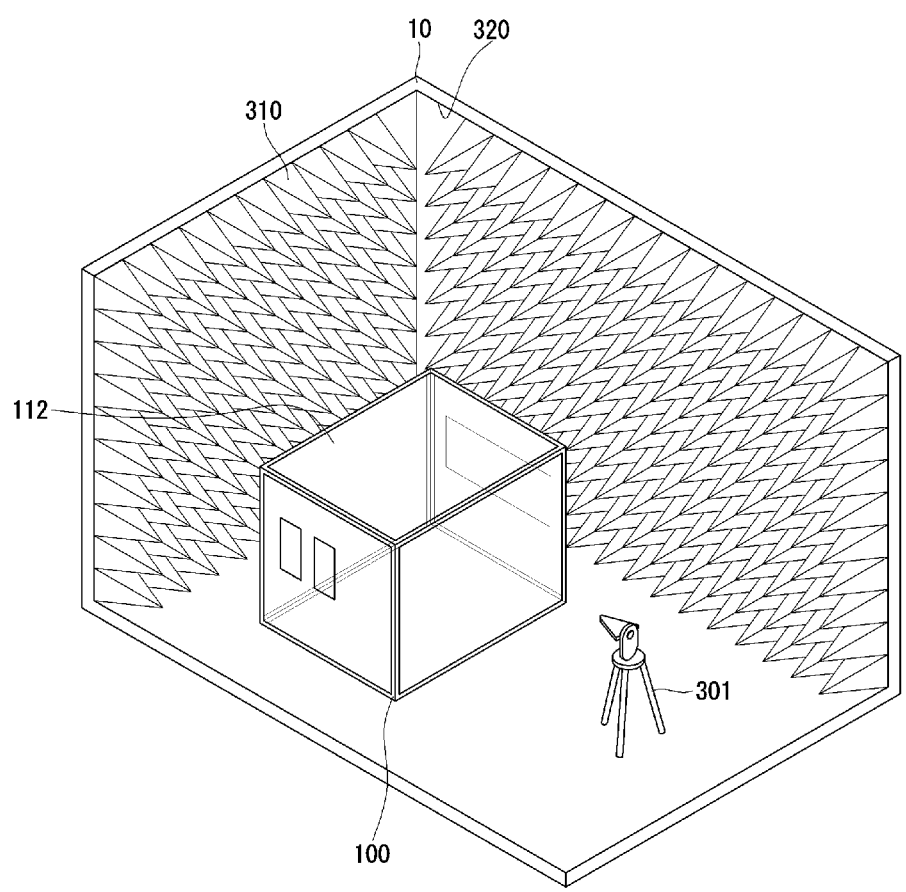
FIG. 3 is a conceptual diagram illustrating a simulation model for evaluating electromagnetic wave attenuation characteristics of a large building according to the present disclosure.

FIG. 3 is a conceptual diagram illustrating a simulation model for evaluating electromagnetic wave attenuation characteristics of a large building according to the present disclosure.

Referring to FIG. 3, the electromagnetic wave evaluation apparats according to an exemplary embodiment of the present disclosure may comprise an electromagnetic wave non-reflecting outer structure 10 in which electromagnetic wave absorbers are installed on interior walls and an evaluation space is formed therein; a building-simulating structure 100 which is installed in the evaluation space inside the electromagnetic wave non-reflecting outer structure 10 and in which electromagnetic wave absorbers 112 capable of adjusting a quality factor are installed; a transmitting end 301 installed inside or outside the building-simulating structure 100 in the evaluation space and transmitting an electromagnetic wave; and a receiving end 301' installed outside or inside the building-simulating structure in the evaluation space.

The building-simulating structure 100, which is a test facility simulating a general building, may be located in the electromagnetic wave non-reflecting outer structure 10.

The building-simulating structure 100 is exposed to various electromagnetic environments such as electromagnetic wave attenuation and indoor electromagnetic wave environment, or electromagnetic wave reciprocity, which are generated assuming a situation in which electromagnetic waves are incident to a large facility such as a building. The building-simulating structure 100 may be located in the electromagnetic wave non-reflecting outer structure 10 to prevent electromagnetic waves generated during the experiments from affecting surrounding facilities. Electromagnetic waves generated inside and outside the building-simulating structure 100 do not leak out of the electromagnetic wave non-reflecting outer structure 10 by absorbers 310 installed on the interior walls of the electromagnetic wave non-reflecting outer structure 10. The building-simulating structure 100 is a structure using electromagnetic wave absorbers 112 to simulate shielding characteristics of a general building to be evaluated. When evaluating attenuation of electromagnetic waves generated outside the building-simulating structure 100, the transmitting end 301 may be located outside the building-simulating structure 100.

The electromagnetic wave non-reflecting outer structure 10 may be an anechoic room or a semi-anechoic chamber. The absorbers 310 having a material and shape for reducing electromagnetic wave reflection may be attached to the interior walls of the electromagnetic wave non-reflecting outer structure 10. The electromagnetic wave non-reflecting outer structure 10 may be designed and manufactured with shielding materials 320 that are metal materials having a high shielding effect in order to block the effects of experiments performed using electromagnetic waves on external facilities.

The transmitting end 301 may be spaced apart from the building-simulating structure 100 by a distance that the electromagnetic wave is approximated as a plane wave and injected into the building-simulating structure as in a continuous wave injection scheme. The transmitting end may include a signal generator and a transmit antenna for applying a continuous wave signal so that the building-simulating structure is positioned within a half-power beam width (HPBW) of the transmit antenna.

A receive antenna of the receiving end 301' may be at least one of an electric field probe, a magnetic field probe, an isotropic antenna, a directional antenna, or a combination thereof capable of measuring electric field strengths, magnetic field strengths, or electric powers at various positions outside or inside the building-simulating structure. In addition, the receiving end may include a measuring instrument associated with the receive antenna. When the positions of the transmitting and receiving ends are reversed using the electromagnetic wave reciprocity theorem, the transmitting end 301 may be located inside the building-simulating structure 100, and the receiving end 301' may be located outside the building-simulating structure 100 according to a physical quantity to be measured. In this case, the receiving end 301' for measuring the physical quantity may be installed at the position where the transmitting antenna 301 was located. However, but in some cases, the receiving end 301' may be located closer to the building-simulating structure 100 to measure the required physical quantity.

Figure 4:
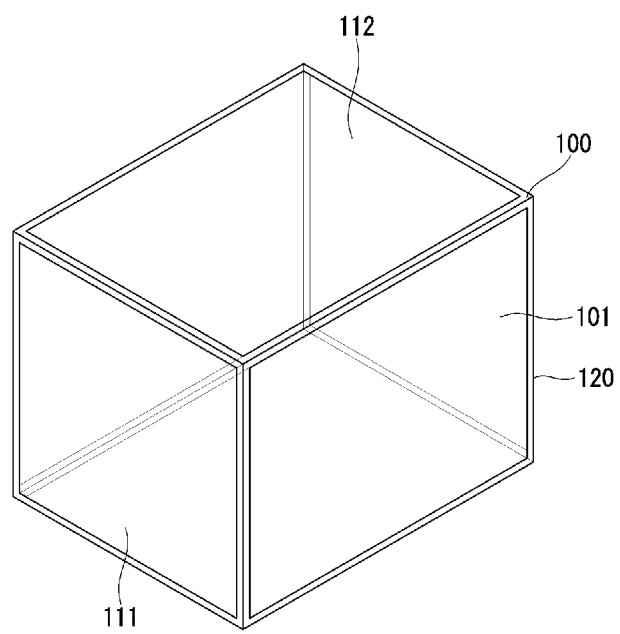
FIG. 4 is a conceptual diagram illustrating a basic configuration of a building-simulating structure according to the present disclosure.

FIG. 4 is a conceptual diagram illustrating a basic configuration of a building-simulating structure according to the present disclosure.

Referring to FIG. 4, a model simulating a specific space of a general large building using an electromagnetic wave absorber is shown.

An electromagnetic wave absorbing wall 101 may be for simulating electromagnetic wave transmission and attenuation characteristics of a general large building. That is, the four sides of the building-simulating structure 100 may be composed of an electromagnetic wave absorbing material such as an electromagnetic wave absorbing sponge. An electromagnetic wave absorbing material having an equivalent loss to an electromagnetic wave transmission loss of concrete may be used for the electromagnetic wave absorbing wall 101. When a sponge-type electromagnetic wave absorber is used, a sponge-type base material having a certain thickness (e.g., about 1 cm) may be formed in two or three layers so as to have a predetermined transmission loss. An absorber having a thickness of about 3 cm may have a transmission loss of −10 dB, and the loss value may vary depending on an operating frequency. Although the sponge-type electromagnetic wave absorber does not have the same physical properties as concrete, it may have an equivalently similar electromagnetic wave transmission loss in an evaluation frequency band. Therefore, it is possible to simulate a certain space of a building using such the electromagnetic wave absorbers. For example, in the case of such the electromagnetic wave absorbers, it is possible to maintain a shape of 50 cm×100 cm, and when a fixing frame is used, it is possible to simulate a certain space in a general large building.

For a base surface 111, a material capable of simulating electromagnetic wave characteristics of a floor surface of a real building based on absorbers may be used, or a floor surface of the electromagnetic wave non-reflecting outer structure 10 may be used as it is. The base surface 111 may be grounded, which is the same as a grounding of a general large building, so it can be used as it is.

Unlike interior walls, a ceiling surface of the building receives a load of the building, and multiple layers of reinforcing bars are inserted so it can have higher electromagnetic wave shielding properties than walls. In this reason, electromagnetic wave absorbers having a greater transmission loss than the electromagnetic wave absorbers used for the side surfaces may be used for a ceiling surface 112 of the building-simulating structure, or the ceiling surface 112 may be configured with several layers of the electromagnetic wave absorbers used on the side surface.

A fixing frame 120 may maintain its shape by using a light metal. Since the electromagnetic wave absorbing wall 101 is manufactured in a unit of a certain size rather than being manufactured in a large size, the building-simulating structure 100 manufactured using the same may be configured using a structure for fixing the electromagnetic wave absorbers of a small size. In this case, a metal or non-metal material may be used for the fixing frame 120 for fixing the electromagnetic wave absorbers. Although a metal material is advantageous for manufacturing and maintaining a shape of a large structure, reflection by metal or cut-off frequency characteristics due to a shape of the metal structure may affect the electromagnetic wave evaluation apparatus. Therefore, in order to remove this effect, the size of a grid structure of the fixing frame may be designed to have a cut-off frequency equal to or less than the frequency to be evaluated by calculating a cut-off frequency according to the shape of the fixing frame 120. If the cut-off frequency of the metal fixing frame 120 used for fixing the electromagnetic wave absorbers of a unit size when manufacturing the building-simulating structure 100 exists within the frequency to be evaluated, the fixing frame 120 may be made of a non-metal material so that the influence on the frequency to be evaluated can be minimized. In order not to affect the electromagnetic wave evaluation, the fixing frame 120 may be configured using a non-metal material having a low dielectric constant. However, there may be difficulties in maintaining the shape when manufacturing a large structure.

Figure 5:
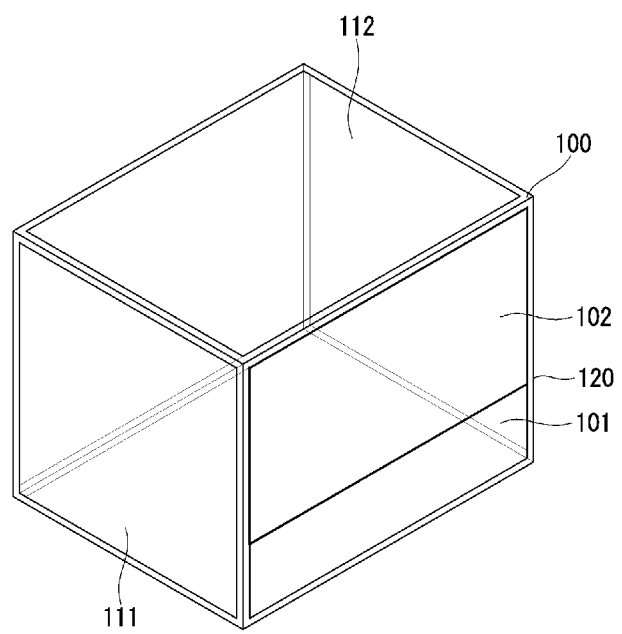
FIG. 5 is a conceptual diagram illustrating a configuration in which a transmission loss of a specific area is changed to be more similar to a space in a general large building.

FIG. 5 is a conceptual diagram illustrating a configuration in which a transmission loss of a specific area is changed to be more similar to a space in a general large building.

Referring to FIG. 5, an electromagnetic wave shielding sheet 102, which is an additional electromagnetic wave absorber, may be attached on the existing electromagnetic wave absorption wall to simulate low-emissivity (Low-E) glass, which is recently widely used in general large buildings to improve thermal efficiency. In the case of low-E glass, a thin metal film is added to a tempered glass to improve heat blocking properties, and it has a higher electromagnetic wave shielding effect than general tempered glass.

The electromagnetic wave shielding sheet 102 is for implementing a higher electromagnetic wave transmission loss. Therefore, absorbers having the same electromagnetic wave loss as the electromagnetic wave absorbing walls constituting the side surfaces may be used for the electromagnetic wave shielding sheet. However, considering the difference in transmission loss or shielding effect between the generally known concrete and low-E glass, in order to simulate low-E glass using the same material as the electromagnetic wave absorbing wall 101, the thickness of the electromagnetic wave shielding sheet becomes thick, so it may be difficult to attach it to the electromagnetic wave absorption wall. For example, the electromagnetic wave shielding sheet may have a thickness several times or more compared to the thickness of the low-E glass to be simulated.

Therefore, by attaching a thin electromagnetic wave shielding sheet using the high electromagnetic wave attenuation principle of low-E glass (Low Emissivity, Low-E) to the electromagnetic wave absorption wall 101, it may be configured to have an electromagnetic wave loss of −30 dB or more. In this case, as the electromagnetic wave shielding sheet, not only an electromagnetic wave shielding sheet used for electromagnetic wave shielding but also an electromagnetic wave shielding fiber or an electromagnetic wave shielding film may be utilized. In the case of a window used in a general building, it has a structure in which glass is arranged on a window frame made of metal, and the metal fixing frame 120 made of a metal material may be used in order to simulate the electromagnetic wave shielding characteristics of a glass window frame made of metal.

Figure 6:
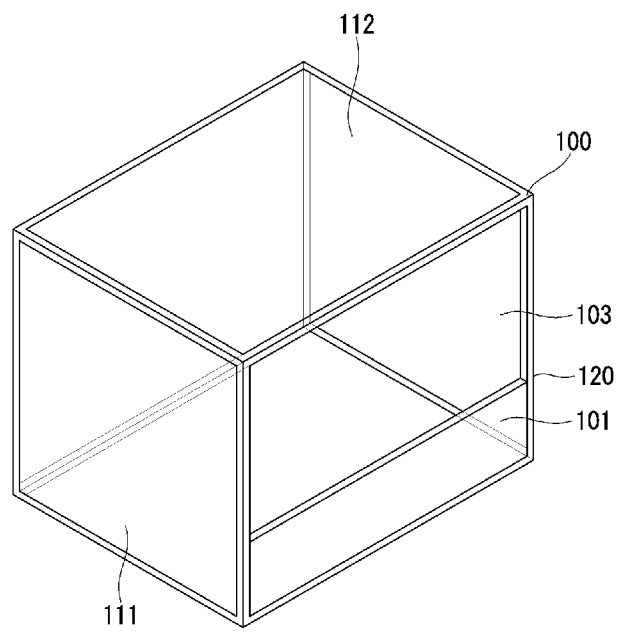
FIG. 6 is a conceptual diagram illustrating a building-simulating structure having a large aperture according to an exemplary embodiment of the present disclosure.

FIG. 6 is a conceptual diagram illustrating a building-simulating structure having a large aperture according to an exemplary embodiment of the present disclosure.

Referring to FIG. 6, in order to test electromagnetic wave attenuation and indoor electromagnetic wave environment by a space having a tempered glass structure that has little shielding effect unlike low-E glass with high shielding properties, the building-simulating structure may have a large aperture from which the absorbers are removed.

Since the tempered glass has almost no electromagnetic wave loss except for resonance characteristics at a specific frequency of a thin dielectric plate, tempered glass having a multilayer structure may be simulated using the large aperture according to electromagnetic modeling. Reflecting this, in the building-simulating structure according to the present disclosure, a large aperture 103 may be formed by removing a part of the electromagnetic wave absorbing wall to simulate an interface made of a tempered glass material. Even in this case, the metal fixing frame 120 may be configured in a grid shape so as to simulate the cut-off frequency characteristic by the metal frame formed on the window. Through this configuration, it is possible to evaluate and analyze not only the effect of the large aperture on the space within the building-simulating structure 100 but also the influence of the metal window frame having a grid shape.

Figure 7:
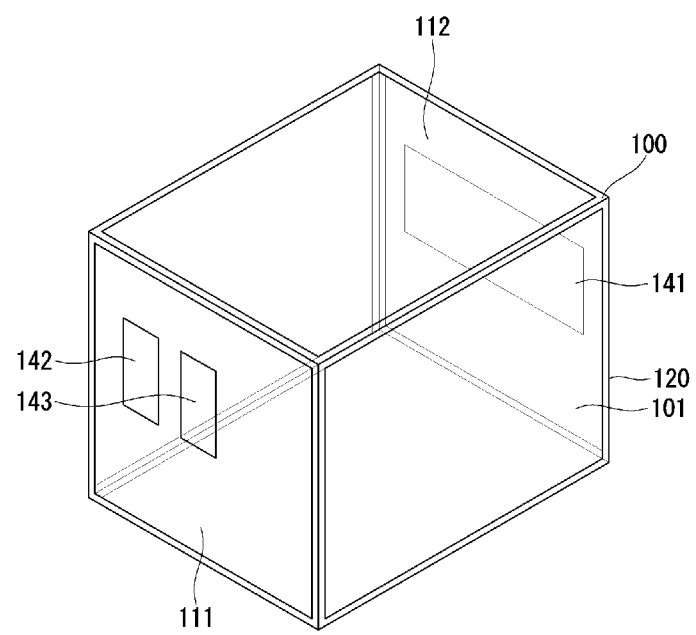
FIG. 7 is a conceptual diagram illustrating a state in which structures simulating various electromagnetic wave environments that may occur in a general large building are attached to wall surfaces inside the building-simulating structure according to the present disclosure.

FIG. 7 is a conceptual diagram illustrating a state in which structures simulating various electromagnetic wave environments that may occur in a general large building are attached to wall surfaces inside the building-simulating structure according to the present disclosure.

Referring to FIG. 7, in order to simulate a complex indoor electromagnetic wave environment experienced by electromagnetic waves incident inside, electromagnetic wave control units, which are structures capable of controlling reflection or absorption, may be disposed in the building-simulating structure 100. FIGS. 4 to 6 illustrate a case in which no structures exist inside the building-simulating structure 100, unlike the actual space of the general building to be evaluated. However, in an interior space of the general building, furniture, equipment, and facilities suitable for a purpose of use of the space are arranged, and these may generate complex electromagnetic wave characteristics such as absorption, scattering, reflection, and diffraction for incident electromagnetic waves.

As shown in FIG. 7, the electromagnetic wave control units 141, 142, and 143 may be disposed on the wall surfaces for convenience of measuring the indoor electromagnetic wave environment. However, the electromagnetic wave control units 141, 142, and 143 may be implemented in a flat or three-dimensional shape, and a single or multiple structures may be used in combination as the electromagnetic wave control units. The electromagnetic wave control units 141, 142, and 143 may be configured in a form that can be attached to or detached from the side surface 101, and may also be implemented as a flat plate or a three-dimensional structure fixed to the floor 111. The arrangement of the electromagnetic wave control units 141, 142, and 143 may be configured to be similar to the actual electromagnetic wave environment, and the similarity with the real general building space may be evaluated or adjusted through Q factor evaluation with respect to the building-simulating structure 100. When the electromagnetic wave control unit is configured as a fixed structure for controlling the electromagnetic wave environment in the building-simulating structure, a reflector represented by a metal having high conductivity may be used as the electromagnetic wave control unit to implement an additional reflection environment. On the other hand, in order to implement an absorption environment, the electromagnetic wave control unit may be implemented using an electric field absorbing material, a magnetic field absorbing material, and/or a material acting on an electric field and a magnetic field at the same time.

Figure 8:
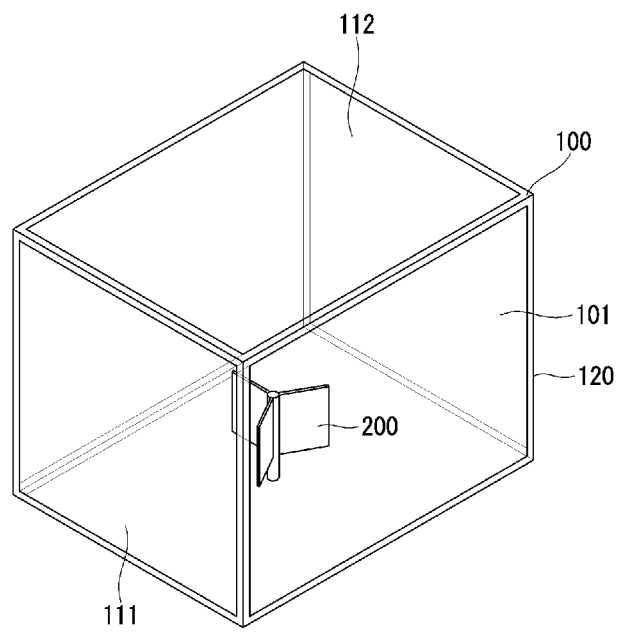
FIG. 8 is a conceptual diagram illustrating an exemplary embodiment of configuring a complex electromagnetic wave environment as in an actual building by locating an electromagnetic wave stirrer having a metal reflector in a building-simulating structure.

FIG. 8 is a conceptual diagram illustrating an exemplary embodiment of configuring a complex electromagnetic wave environment as in an actual building by locating an electromagnetic wave stirrer having a metal reflector in a building-simulating structure.

Referring to FIG. 8, in order to simulate an indoor electromagnetic wave environment, an electromagnetic wave stirrer 200 of a flat or three-dimensional structure 100 may be installed in the building-simulating structure 100, which is formed with a plurality of metal blades rotating at a constant angle or at a constant speed or is formed with a plurality of blades to which an absorber is attached. The electromagnetic wave stirrer 200 may replace the functions of the electromagnetic wave control units 141, 142, and 143.

Figure 9:
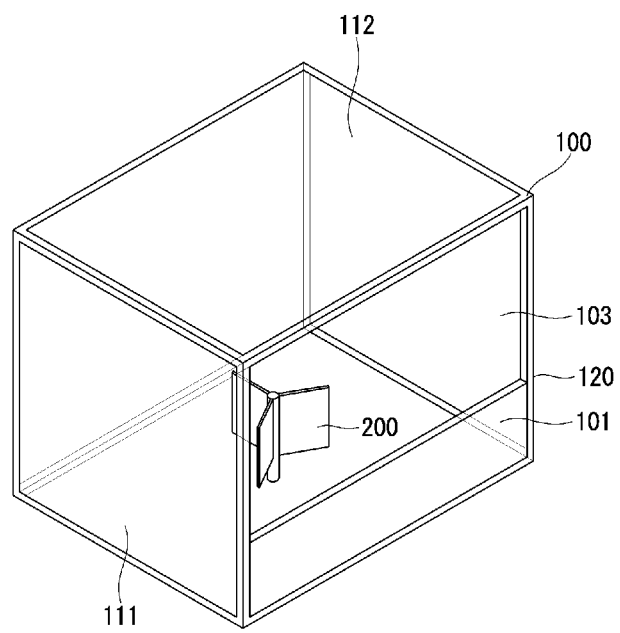
FIG. 9 is a conceptual diagram illustrating an exemplary embodiment in which an electromagnetic wave stirrer having a metal reflector is installed in a building-simulating structure having a large aperture.

FIG. 9 is a conceptual diagram illustrating an exemplary embodiment in which an electromagnetic wave stirrer having a metal reflector is installed in a building-simulating structure having a large aperture.

In order to simulate the complex electromagnetic wave environment that may occur indoors, an electromagnetic wave stirrer instead of a fixed reflector or absorber may be placed in the building-simulating structure with a large aperture.

The building-simulating structures shown in FIGS. 4 to 9 may have different quality factors. For example, in the exemplary embodiments of FIGS. 4 to 6, the quality factor of the building-simulating structure may be changed by transmission and absorption losses of the interfaces. On the other hand, in the exemplary embodiments of FIGS. 7 to 9, the quality factor or electromagnetic wave uniformity of the space to be evaluated may be adjusted by various structures installed and disposed therein.

The quality factor of the indoor environment in a general building is also determined by the transmission and reflection losses of interfaces constituting the indoor environment and absorption, scattering, reflection, and diffraction by various objects arranged in the space. Therefore, the building-simulating structure 100 according to the present disclosure can implement the control on the quality factor according to the interfaces and the quality factor according to the structures disposed in the space or the change of the electromagnetic wave uniformity by reflecting these characteristics.

The various configurations shown in FIGS. 4 to 9 are not limited to the suggested configurations, and various combinations thereof may be possible. For example, it is also possible to use a combination of the electromagnetic wave control unit of FIG. 5 which is a structure for implementing an indoor reflection and absorption environment that simulates low-E glass and the electromagnetic wave stirrer 200 having a metal reflection plate. Unlike a general electromagnetic wave stirrer used in an electromagnetic wave reverberation room, the electromagnetic wave stirrer 200 used in the present disclosure is to simulate an indoor electromagnetic wave environment. Accordingly, the blades of the electromagnetic wave stirrer 200 rotating at a constant angle and at a constant speed may be formed of metal or metal blades with an absorber attached thereto. In this case, the absorber attachable or detachable to the metal blade may have a planar structure or a three-dimensional structure.

Figure 10A:
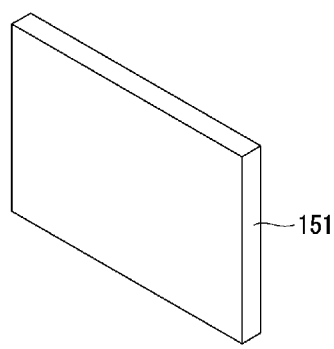
FIGS. 10A to 10C are conceptual diagrams illustrating configurations of electromagnetic wave absorbers constituting electromagnetic wave interfaces of a building-simulating structure according to the present disclosure.
Figure 10B:
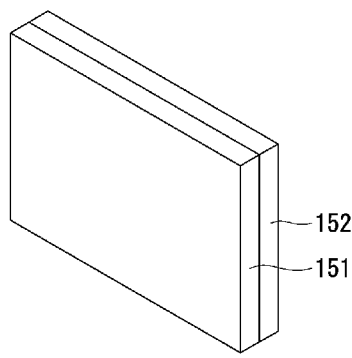
Figure 10C:
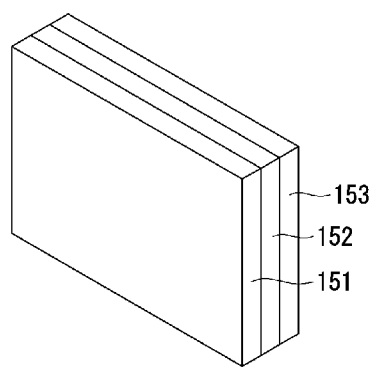

FIGS. 10A to 10C are conceptual diagrams illustrating configurations of electromagnetic wave absorbers constituting electromagnetic wave interfaces of a building-simulating structure according to the present disclosure.

Referring to FIGS. 10A to 10C, electromagnetic wave interfaces 151, 152, and 153 may be formed by physically combining electromagnetic wave absorbers having constant transmission loss and insertion loss to obtain a desired transmission loss. In order to realize the desired transmission loss, an absorbent material having the same characteristics may be used. In order to obtain the desired transmission loss, it is also possible to configure the electromagnetic wave interfaces 151, 152, and 153 using materials having different transmission losses depending on the thickness of the absorbers. Even when an electromagnetic wave absorber having the same loss is used, the desired transmission characteristic may be implemented by varying the thickness thereof.

Figure 11A:
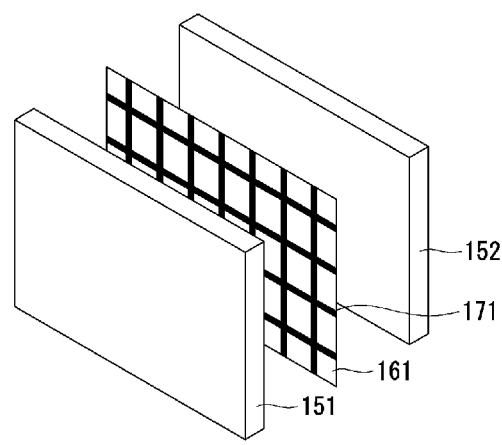
FIGS. 11A and 11B are conceptual diagrams illustrating exemplary embodiments in which a thin film having a metal pattern is inserted into an electromagnetic wave absorber or a metal pattern is formed in the electromagnetic wave absorber.
Figure 11B:
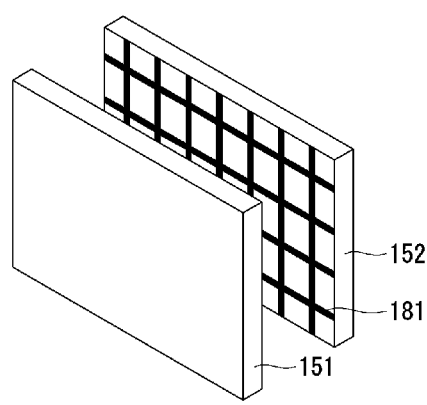

FIGS. 11A and 11B are conceptual diagrams illustrating exemplary embodiments in which a thin film having a metal pattern is inserted into an electromagnetic wave absorber or a metal pattern is formed in the electromagnetic wave absorber.

A wall composed of only concrete without reinforcing bars may be used as an exterior wall of a general building or a wall that does not receive a load. In recent years, as the number of high-rise buildings increases, concrete using reinforcing bars is used to improve the physical strength of the exterior walls of the buildings, so the absorbers 151, 152, and 153 shown in FIG. 10 may not reflect the electromagnetic wave characteristics of the reinforcing bars.

Therefore, as shown in FIG. 11A, a thin film 161 having a metal pattern 171 may be inserted into the absorbers having a loss equivalent to that of concrete in order to simulate the reinforcing bars used in manufacturing the concrete building.

Alternatively or additionally, as shown in FIG. 11B, it may be also possible to form a metal pattern 181 on one side of the electromagnetic wave absorber 152 to have an equivalent loss to reinforced concrete and to simulate the frequency characteristics of the reinforced concrete. In the case of reinforced concrete, not only a single-layer reinforced steel structure, but also multiple layers of reinforced steel structures may be inserted to withstand higher loads.

Figure 12A:
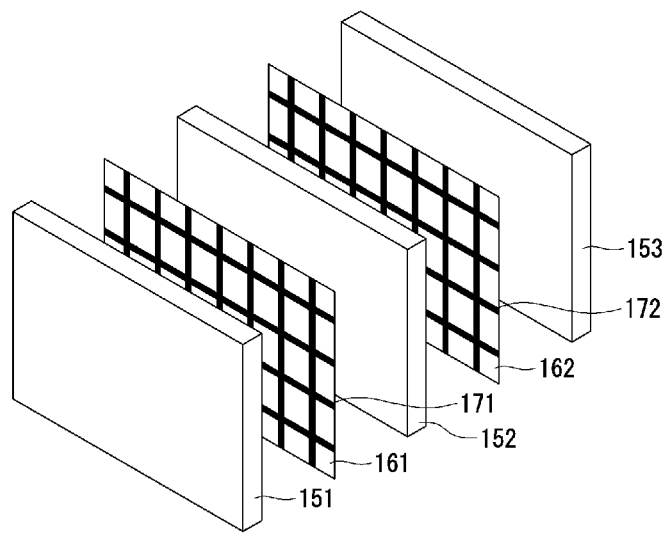
FIGS. 12A and 12B are conceptual diagrams illustrating configurations of electromagnetic wave absorbers capable of simulating characteristics of reinforced concrete.
Figure 12B:
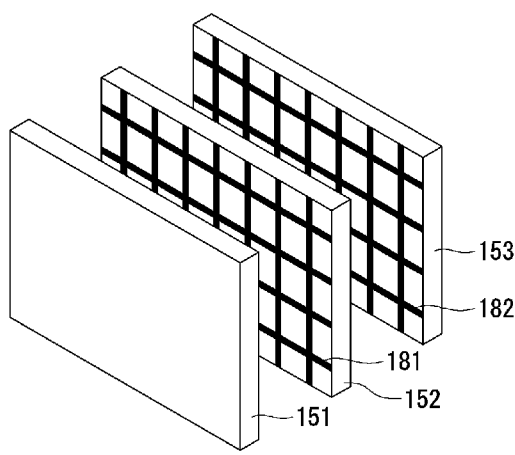

FIGS. 12A and 12B are conceptual diagrams illustrating configurations of electromagnetic wave absorbers capable of simulating characteristics of reinforced concrete.

In FIG. 12A, a configuration of a composite electromagnetic wave absorber configuration is shown in which thin films 161 and 162 having grid structure metal patterns 171 and 172 having a loss equivalent to reinforcing bars are inserted between the electromagnetic wave absorbers 151, 152, and 153.

In FIG. 12B, a configuration of a composite electromagnetic wave absorber configuration is shown in which grid-like metal patterns 181 and 182 having a loss equivalent to reinforcing bars are formed on a surface thereof.

As described above, a structure capable of equivalently simulating the transmission characteristics for each frequency of a concrete wall or a reinforced concrete wall used in a general large-scale building using the electromagnetic wave absorber or the composite electromagnetic wave absorber of FIGS. 10 to 12 has been proposed. That is, using the electromagnetic wave absorber or the composite electromagnetic wave absorber, the building-simulating structure 100 may be configured.

In addition, an equivalent model construction approach for materials constituting interfaces of a general building as well as the concrete or reinforced concrete has been proposed. By applying a thin film structure with a high shielding effect to a thin and lossless material such as Styrofoam using a principle of manufacturing an actual building material such as low-E glass, interfaces similar to those in the actual building may be formed.

The materials introduced in the present disclosure so far are very light materials, so they are easy to handle, and structural changes and various combinations thereof are possible. Therefore, sufficient grounds have been presented that not only the shielding effect of the interfaces of the general building can be effectively simulated, but also that the indoor electromagnetic wave environment generated in the three-dimensional indoor space can be simulated using these materials. Recently, some buildings have a structure finished with a metal panel on the exterior of the buildings, and in this case, similar electromagnetic wave transmission characteristics may be simulated by attaching a thin metal panel or a shielding sheet with high shielding effects to outer walls of the electromagnetic wave absorber on a side where electromagnetic waves are incident.

Although not shown in FIGS. 4 to 9, a door for entry and exit exists in the actual space. In a general building, since the door is made of a material such as wood, tempered glass or metal, these materials may also be simulated through the use or removal of an electromagnetic wave absorber, a shielding sheet, a shielding fiber, a shielding film, and the like. In order to simulate a material having a high transmission loss or absorption loss in the actual building using the building-simulating structure 100, a plurality of electromagnetic wave absorbers described in the present disclosure may be physically combined or used or a shielding sheet, shielding fiber, a thin shielding material such as a shielding film may be used. In addition to the physical combination of the absorbers, it is also possible to use an electromagnetic wave absorber manufactured based on a chemical composition of various materials that simulates the electromagnetic wave transmission and absorption loss of the actual building. The building-simulating structure according to the present disclosure can control a quality factor of a two-dimensional interface having transmission characteristics. In addition, the building-simulating structure according to the present invention configures an indoor electromagnetic wave environment by adjusting a quality factor of a three-dimensional space composed of interfaces having various shielding effects, thereby simulating electromagnetic wave indoor environments of various frequency bands. Therefore, the building-simulating structure according to the present disclosure provides a function to evaluate a communication service quality or various scenarios that may occur in the indoor environments such as electromagnetic wave attenuation by a building during an external electromagnetic wave attack.

The building-simulating structure according to the present disclosure is not limited to one space, and a plurality of spaces may be simulated as in a general building by a combination of building-simulating structures.

In addition, in order to overcome the spatial constraints of the anechoic chamber or semi-anechoic chamber 10, the building-simulating structure 100 may be evaluated by implementing the building-simulating structure 100 as a reduced model of the entire large building or using a frequency corresponding to the size thereof.

Since the wall surfaces of the building-simulating structure 100 according to the present disclosure are for simulating wall surfaces of a general building, the wall surfaces of the building-simulating structure 100 may have a curved shape if necessary. In addition, since a specific space of a general building may be formed as a space of various structures rather than a hexahedron, the structure of the building-simulating structure 100 is also not limited to a hexahedron in order to simulate such an environment, but may be configured as a polyhedron.

The materials used in implementation of the building-simulating structure 100 described in the present disclosure may be configured to have a light weight. Therefore, the building-simulating structure may be changed to various structures through a scheme of utilizing hinges in the fixing frame 120 connecting the wall surfaces, a scheme of forming a structure that is easy to assemble, a scheme of forming a structure movable using wheels for movement, a scheme of forming a structure changeable without assembling and disassembling, and/or the like.

As described above, unlike the existing shielded room and electromagnetic wave reverberation room, the electromagnetic wave evaluation apparatus according to the exemplary embodiment of the present disclosure can control the electromagnetic wave transmission characteristics of interfaces of a general building, and can control indoor absorption, scattering, reflection, diffraction, and the like. Accordingly, based on the structure capable of simulating the interfaces of the general building and indoor electromagnetic wave environments having different shielding effects, the electromagnetic wave evaluation apparatus can provide the function of simulating and analyzing an electromagnetic wave environment formed indoors by electromagnetic waves incident from the outside as well as electromagnetic wave attenuation due to a high-power electromagnetic wave attack. In addition, since it is easy to change the structure using light materials, various electromagnetic wave environments can be implemented, and it can be used as a reproducible indoor electromagnetic wave environment standard facility. That is, the electromagnetic wave evaluation apparatus according to the exemplary embodiment of the present disclosure can be used for evaluating electromagnetic wave-related characteristics for building materials, parts materials for electric and electronic devices, etc., and can be used as a basic facility for establishing a standardized evaluation method.

The operations of the method according to an embodiment of the present disclosure can also be embodied as computer-readable programs or codes on a computer-readable recording medium. The computer-readable recording medium includes any type of recording apparatus in which data readable by a computer system is stored. The computer-readable recording medium can also be distributed over network-coupled computer systems so that computer-readable programs or codes are stored and executed in a distributed fashion.

Also, examples of the computer-readable recording medium may include a hardware device such as ROM, RAM, and flash memory, which are specifically configured to store and execute program commands. The program commands may include high-level language codes executable by a computer using an interpreter as well as machine codes made by a compiler.

Although some aspects of the disclosure have been described in the context of an apparatus, it is clear that these aspects also represent a description of the corresponding method, where a block or apparatus corresponds to a method step or a feature of a method step. Analogously, aspects described in the context of a method step may also represent a description of a corresponding block or item or feature of a corresponding apparatus. Some or all of the method steps may be performed by means of (or by using) a hardware device such as, for example, a microprocessor, a programmable computer, or an electronic circuit. In some embodiments, one or more of the most important method steps may be performed by such a device.

In some embodiments, a programmable logic device (for example, a field-programmable gate array) may be used to perform some or all of the functionalities of the methods described herein. In some embodiments, a field-programmable gate array may cooperate with a microprocessor in order to perform one of the methods described herein. Generally, the methods are performed by any hardware device.

While the exemplary embodiments of the present disclosure and their advantages have been described in detail, it should be understood that various changes, substitutions and alterations may be made herein without departing from the scope of the present disclosure.

What is claimed is:

1. An apparatus for electromagnetic wave evaluation, comprising:
   an electromagnetic wave non-reflecting outer structure in which electromagnetic wave absorbers are installed on interior walls and an evaluation space is formed therein;
   a building-simulating structure which is installed in the evaluation space inside the electromagnetic wave non-reflecting outer structure and in which electromagnetic wave absorbers capable of adjusting a quality factor are installed;
   a transmitting end installed inside or outside the building-simulating structure in the evaluation space and transmitting an electromagnetic wave; and
   a receiving end installed outside or inside the building-simulating structure in the evaluation space.

2. The apparatus according to claim 1, wherein the electromagnetic wave absorbers installed on the interior walls of the electromagnetic wave non-reflecting outer structure have a material and shape for reducing electromagnetic wave reflection, and at least part of the electromagnetic wave absorbers use a metal material with a high shielding effect to block an influence of experiments conducted in the evaluation space using the electromagnetic wave on external facilities.

3. The apparatus according to claim 1, wherein when the transmitting end is located outside the building-simulating structure, the transmitting end is spaced apart from the building-simulating structure by a distance at which the electromagnetic wave is approximated as a plane wave and injected into the building-simulating structure in a continuous wave injection scheme, and the transmitting end includes a signal generator and a transmit antenna for applying a continuous wave signal so that the building-simulating structure is positioned within a half-power beam width (HPBW) of the continuous wave signal.

4. The apparatus according to claim 1, wherein a receive antenna of the receiving end is at least one of an electric field probe, a magnetic field probe, an isotropic antenna, a directional antenna, or a combination thereof capable of measuring electric field strengths, magnetic field strengths, or electric powers at various positions outside or inside the building-simulating structure, and the receiving end includes a measuring instrument associated with the receive antenna.

5. The apparatus according to claim 1, wherein the building-simulating structure further includes:
   a fixing frame installed in at least some corners; and
   a plurality of electromagnetic wave absorbing walls that are installed using the fixing frame, are replaceable so that materials thereof are changeable, and are made of electromagnetic wave absorbers.

6. The apparatus according to claim 5, wherein four sides of the building-simulating structure are composed of the electromagnetic wave absorbing walls composed of electromagnetic wave absorbers having an equivalent loss to an electromagnetic wave transmission loss of concrete, and when sponge-type electromagnetic wave absorbers are used, a sponge-type base material having a certain thickness is formed in two or three layers so as to have a predetermined transmission loss.

7. The apparatus according to claim 1, wherein a floor surface of the building-simulating structure uses an absorber material capable of simulating electromagnetic wave characteristics of a floor surface of a real building or uses a floor surface of the electromagnetic wave non-reflecting outer structure, and further includes a grounded base surface.

8. The apparatus according to claim 1, wherein a ceiling surface of the building-simulating structure uses electromagnetic wave absorbers having a greater transmission loss than electromagnetic wave absorbers of an electromagnetic wave absorption wall used on a side surface of the building-simulating structure, or is configured by adding electromagnetic wave absorbers of the electromagnetic wave absorption wall used on the side surface.

9. The apparatus according to claim 1, wherein the building-simulating structure includes a fixing frame made of a metal material in which a size of a grid structure is designed to have a cut-off frequency below a frequency to be evaluated.

10. The apparatus according to claim 1, wherein when a cut-off frequency of a metal frame used for fixing electromagnetic wave absorbers of a unit size is within a frequency to be evaluated, the building-simulating structure includes a fixing frame of a non-metal material having a low dielectric constant to minimize an influence on the frequency to be evaluated.

11. The apparatus according to claim 1, wherein the building-simulating structure has an aperture without absorbers for a test on an indoor electromagnetic wave environment and an electromagnetic wave attenuation by a space having a tempered glass structure with little shielding effects.

12. The apparatus according to claim 11, wherein the aperture includes a window frame composed of a grid-shaped metal fixing frame, and an inner side of the window frame is composed of tempered glass having a multi-layer structure.

13. The apparatus according to claim 1, wherein a flat or three-dimensional electromagnetic wave control unit capable of adjusting a reflection or absorption phenomenon is disposed in the building-simulating structure to simulate an indoor electromagnetic wave environment experienced by the electromagnetic wave.

14. The apparatus according to claim 13, wherein the electromagnetic wave control unit is composed of a metal reflector having high conductivity to implement a reflection environment, or is composed of at least one of an electric field absorbing material, a magnetic field absorbing material, a material acting on both an electric field and a magnetic field, or a combination thereof to implement an absorption environment.

15. The apparatus according to claim 1, wherein an electromagnetic wave stirrer of a flat or three-dimensional structure is installed, which is formed with a plurality of metal blades rotating at a constant angle or at a constant speed to simulate an indoor electromagnetic wave environment, or is formed with a plurality of blades to which an absorber is attached.

16. The apparatus according to claim 1, wherein a plurality of electromagnetic wave interfaces made of a same material having a certain amount of transmission loss and a certain amount of insertion loss are formed so as to have different transmission losses according to different thicknesses.

17. The apparatus according to claim 1, wherein the building-simulating structure is composed of electromagnetic wave absorbers in which a thin film having a metal pattern is inserted or electromagnetic wave absorbers in which a metal pattern is formed.

18. The apparatus according to claim 1, wherein the building-simulating structure is composed of absorbers that simulate loss and frequency characteristics equivalent to those of concrete and into which a thin film having a metal pattern is inserted in order to simulate reinforcing bars used in concrete building production.

19. The apparatus according to claim 1, wherein the building-simulating structure is composed of a composite electromagnetic wave absorber in which a thin film having a metal pattern of a conductive lattice structure is inserted between electromagnetic wave absorbers.

20. The apparatus according to claim 1, wherein the building-simulating structure is composed of a composite electromagnetic wave absorber having a grid-shaped metal pattern on one or both surfaces thereof.

* * * * *